(12) United States Patent
Jin

(10) Patent No.: US 6,998,903 B2
(45) Date of Patent: Feb. 14, 2006

(54) INTERNAL SUPPLY VOLTAGE GENERATOR FOR DELAY LOCKED LOOP CIRCUIT

(75) Inventor: Seung Eon Jin, Seoul (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 65 days.

(21) Appl. No.: 10/876,119

(22) Filed: Jun. 24, 2004

(65) Prior Publication Data

US 2005/0231271 A1   Oct. 20, 2005

(30) Foreign Application Priority Data

Apr. 20, 2004   (KR) ..................... 10-2004-0027100

(51) Int. Cl.
*G05F 1/10* (2006.01)
(52) U.S. Cl. ..................... 327/541; 327/540; 323/316
(58) Field of Classification Search ................ 327/538, 327/540, 541, 543, 546; 323/313, 316
See application file for complete search history.

(56) References Cited

U.S. PATENT DOCUMENTS

| | | | |
|---|---|---|---|
| 5,300,823 A * | 4/1994 | Ihara | 327/544 |
| 5,321,653 A * | 6/1994 | Suh et al. | 365/189.09 |
| 5,349,559 A * | 9/1994 | Park et al. | 365/201 |
| 5,721,485 A * | 2/1998 | Hsu et al. | 713/323 |
| 6,046,624 A * | 4/2000 | Nam et al. | 327/530 |
| 6,107,789 A * | 8/2000 | Fryer et al. | 323/316 |
| 6,184,744 B1 * | 2/2001 | Morishita | 327/541 |
| 6,373,754 B1 * | 4/2002 | Bae et al. | 365/189.09 |

* cited by examiner

*Primary Examiner*—Terry D. Cunningham
(74) *Attorney, Agent, or Firm*—Marshall, Gerstein & Borun LLP

(57) ABSTRACT

Provided is directed to an internal supply voltage generator for a delay locked loop circuit which can prevent a tAC for a next read command from being outputted with a delay, by blocking a supply voltage VDLL from a transient lowering regardless of a reacting speed of a VDLL supply voltage generator by means of maximizing a driving power of the VDLL supply voltage generator which generates the supply voltage VDLL of a delay locked loop during entering time from a power down period to a power up period. Furthermore, as the supply voltage VDLL is prevented from lowering without rising the reacting speed of the VDLL supply voltage generator, it is advantageous to prevent a distorting phenomenon of the supply voltage VDLL in response to a fast reacting speed of the VDLL supply voltage generator.

5 Claims, 2 Drawing Sheets

INTERNAL SUPPLY VOLTAGE GENERATOR FOR DELAY LOCKED LOOP CIRCUIT

This application relies for priority upon Korean Patent Application No. 2004-0027100 filed on Apr. 20, 2004, the contents of which are herein incorporated by reference in their entirety.

BACKGROUND

1. Field of the Invention

The present invention is related to an internal supply voltage generator for a delay locked loop (DLL) circuit, and more particularly, to an internal supply voltage generator for a delay locked loop circuit, capable of preventing a voltage supplied to the DLL circuit by a circuit operation from lowering, during entering time from a power down period to other periods.

2. Discussion of Related Art

A delay locked loop DLL circuit receives a clock signal inputted from the external of a system and identifies an internal clock signal necessary in a system to a synchronization of a clock signal inputted from the external. This device supplying a driving voltage to the DLL is an internal supply voltage generator for the DLL circuit (hereinafter, referring as to a VDLL supply voltage generator).

FIG. 1 is a circuit diagram illustrating structures and operations of the internal supply voltage generator for the DLL circuit according to the conventional art.

Referring to FIG. 1, a VDLL supply voltage generator 110 supplying a supply voltage VDLL to a delay locked loop 120 generates the supply voltage VDLL by means of a reference voltage VREF, and is comprised of a comparator 111 and a switching device P111. Here, the reference voltage VREF is inputted to a first input terminal of the comparator 111, and the switching device P111 outputs an external supply voltage VDD as the supply voltage VDLL of the delay locked loop 120 by an analog-type operation, according to an output signal of the comparator 111. During this, the voltage switched by the switching device is inputted to a second input terminal of the comparator 111 and thus the reference voltage VREF and the supply voltage VDLL are identical by a feedback of the supply voltage VDLL and the analog-type operation.

On the other side, the delay locked loop 120 is operated by a power down signal PWRDN. The power down signal PWRDN is generated to a high level signal when its entering to a power down period is detected according to a clock enable signal CKE, and thus the delay locked loop 120 is stopped for an operation in the power down period according to the power down signal PWRDN, to minimize power consumption. While this, a lock information is latched and stored in the delay locked loop 120 before entering to the power down period.

As aforementioned, when the delay locked loop 12 is not operated in the power down period, there is no power consumption and then the supply voltage VDLL is risen. The rising of the supply voltage VDLL is dependant on a reacting speed of the VDLL supply voltage generator 110. When the reacting speed is fast, a width of the rising is narrow, while the width of the rising is wide when the reacting speed is slow.

In case of exiting the power down period, the power down signal PWRDN becomes low level, and the delay locked loop 120 is operated thereby. Here, the supply voltage VDLL is transiently used, which leads a level of the supply voltage VDLL to be lowered. Accordingly, the lowering rate of the supply voltage VDLL is decided according to the reacting speed of the VDLL power source generator 110 and degree of using a unit delay before the power down period.

In general, the reacting speed of the VDLL power source generator 110 is not fast. This is for preventing a fluctuation phenomenon of the supply voltage VDLL by a fast reacting speed from being generating.

As described above, if the reacting speed of the VDLL power source generator 110 is low and a transient falling speed is faster, it causes a problem that an output data access time from Clk tAC is outputted for a next read command with a delay.

SUMMARY OF THE INVENTION

The present invention is directed to provide an internal supply voltage generator for a delay locked loop circuit that maximizes a driving power of a VDLL supply voltage generator, which generates a supply voltage VDLL of a delay locked loop during entering time from a power down period to a power up period, to prevent the supply voltage VDLL from a transient lowering, regardless of a reacting speed of the VDLL supply voltage generator, so as to prevent a tAC from being outputted with a delay, for a next read command. In addition, because the supply voltage VDLL is prevented from lowering without raising the reacting speed of the VDLL supply voltage generator, it is advantageous to prevent the supply voltage VDLL from being distorting due to a fast reacting speed of the VDLL supply voltage generator.

One aspect of the present invention is to provide an internal supply voltage generator for a delay locked loop circuit, comprising: a comparator of which a reference voltage is applied to a first input terminal, and an output terminal is connected to a second input terminal; an output switching device connected between an output terminal and an external supply voltage terminal and operated according to an output signal of the comparator; and an output controller which blocks the output signal of the comparator and the external supply voltage from transferring to the output switching device and sets to turn on the output switching device, according to a control signal in a power down period, and transfers the output signal of the comparator and the external supply voltage to the output switching device in other periods.

Here, the output switching device is performed by an analog-type operation according to the output signal of the comparator, and adaptable to be embodied with a PMOS transistor.

The output controller is comprised of: a first switching device which is connected between an external supply voltage terminal and the output switching device, and blocks the external supply voltage from a power period according to the control signal; a second switching device which sets to turn on the output switching device in a power down period by switching a ground voltage according to the control signal; and a switching unit which blocks the output signal of the comparator in the power down period according to the control signal.

The switching unit is comprised of an inverter inverting the control signal, and a transmission gate operated by an output signal of the inverter and the control signal.

BRIEF DESCRIPTION OF THE DRAWINGS

A more complete understanding of the present invention may be had by reference to the following description when taken in conjunction with the accompanying drawings in which.

DETAILED DESCRIPTION OF PREFERRED EMBODIMENTS

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the invention to those skilled in the art. Like numerals refer to like elements throughout the specification.

Figure 1:
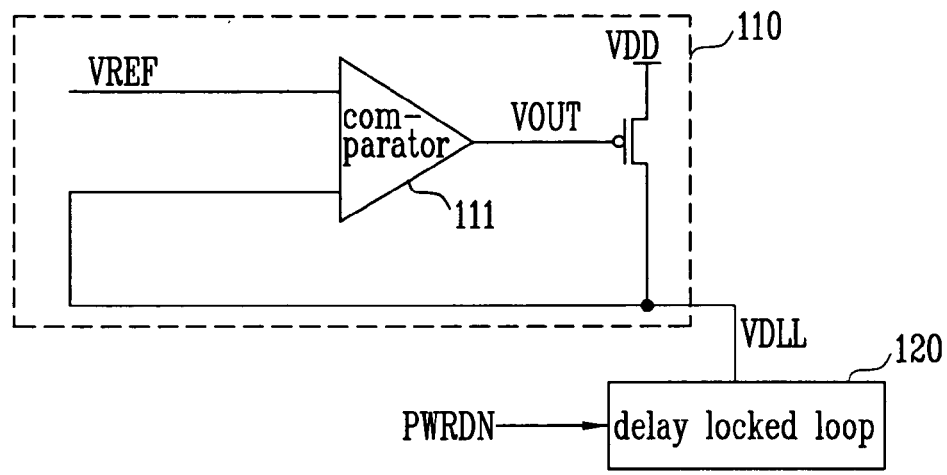
FIG. 1 is a circuit diagram illustrating an internal supply voltage generator for a delay locked loop circuit of the conventional art.
Figure 2:
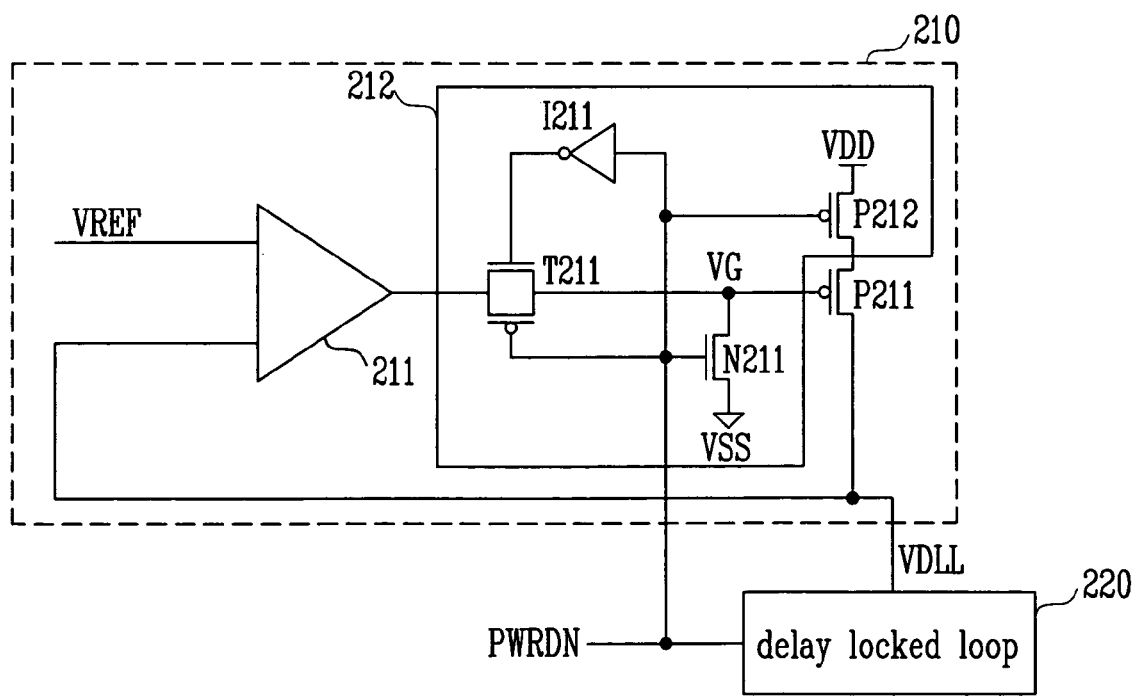
FIG. 2 is a circuit diagram illustrating an internal supply voltage generator for a delay locked loop circuit in accordance with a preferred embodiment of the present invention.

FIG. 2 is a circuit diagram illustrating an internal supply voltage generator for a delay locked loop circuit in accordance with an embodiment of the present invention.

Referring to FIG. 2, a VDLL supply voltage generator 210 supplying a supply voltage VDLL to a delay locked loop 220 is operated by a control signal (hereinafter, referred to as a power down signal PWRDN) and generates the supply voltage VDLL to a target level according to a reference signal VREF, by comprising a comparator 211, an output controller 212, and an output switching device P211.

Here, the delay locked loop 220 minimizes power consumption by stopping an operation during a power down period according to the power down signal PWRDN. During this, a lock information is latched and stored in the delay locked loop 220 before the delay locked loop 220 enters to the power down period.

The power down signal PWRDN is generated to a high level signal when it is detected to enter the power down period according to a clock enable signal CKE.

Hereinafter, it will be explained of structures and operations the VDLL supply voltage generator 210 in more detail.

The reference voltage VREF is inputted to a first input terminal of the comparator 211 included in the VDLL supply voltage generator 210. A second input terminal is connected to an output terminal of the VDLL supply voltage generator 210, to feedback the supply voltage applied to the delay locked loop 220 through the output terminal.

The switching device P211 switches an external supply voltage VDD to the output terminal of the VDLL supply voltage generator 210, by the analog-type operation according to the output signal of the comparator 211 transferred through the output controller 212. Here, the switched voltage becomes a supply voltage VDLL of the delay locked loop 220. The switching device P211 is available to be embodied with a PMOS transistor. On the other hand, the reference voltage VREF and the supply voltage VDLL are identical by feedbacking the supply voltage VDLL to the comparator 211 and the analog operation of the switching device P211.

The output controller 212 blocks the external supply voltage VDD and the output signal of the comparator 211 from being transferred to the output switching device P211 and sets to turn on the output switching device, in the power down period according to the power down signal PWRDN. Furthermore, in case of exiting the power down period, the output controller 212 transfers the external supply voltage VDD as well as the output signal of the comparator 211 to the switching device P211.

The output controller 212 may be embodied with a scheme as follows.

For instance, the output controller 212 is available to be embodied with only three switching devices. For more detailed explanation, the output controller 212 is comprised of: a first switching device P212 which is connected between an external supply voltage terminal and the output switching device P211 and transfers the external supply voltage VDD to the output switching device P211 according to the power down signal PWRDN; switching units T211, I211 which transfer the output signal of the comparator 212 to the output switching device P211 for operating the output switching device P211 by the output signal of the comparator 212, according to the power down signal PWRDN; and a second switching device N211 according to the power down signal PWRDN. Here, the switching units T211, I211 are preferably comprised of an inverter I211 for inverting the power down signal PWRDN and a transmission gate T211 operated according to an output signal of the inverter I211 and the power down signal PWRDN, in order to precisely transfer the output signal of the comparator 212 to the output switching device P211 by improving a current driving power.

It will be described about operations of the VDLL supply voltage generator 210 with reference to the accompanying waveform diagram as follows.

Figure 3:
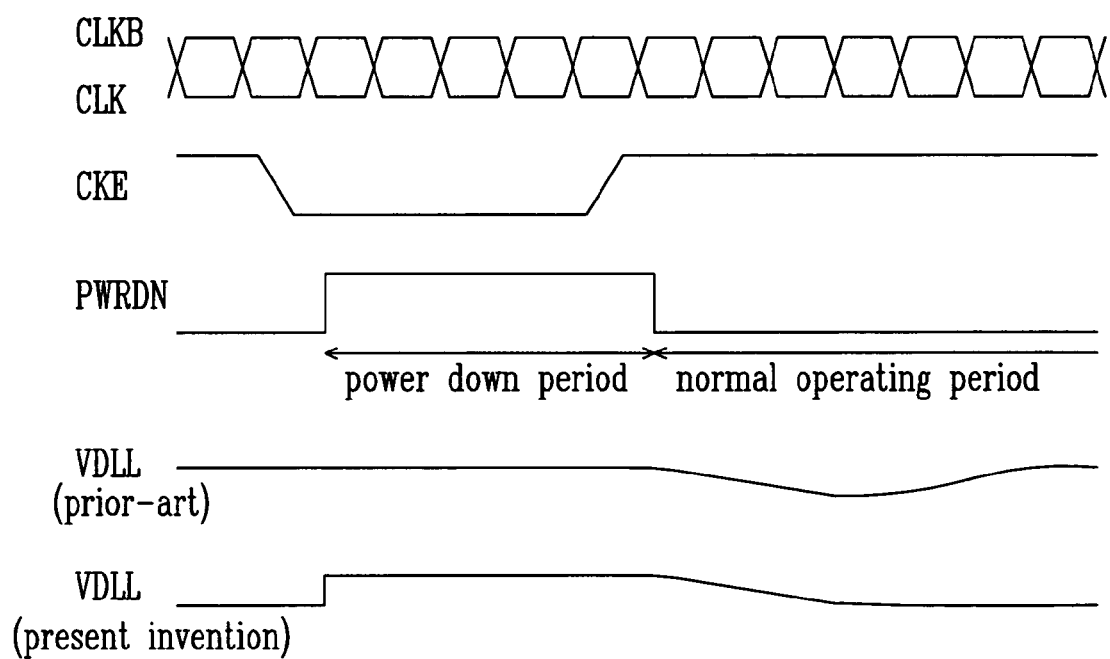
FIG. 3 is a waveform diagram illustrating operations of a VDLL supply voltage generator of FIG. 2.

FIG. 3 is a waveform diagram illustrating operations of the VDLL supply voltage generator of FIG. 2.

Referring to FIGS. 2 and 3, the power down signal PWRDN is applied to low level in an initial operating period. The first switching device P212 is turned on by the power down signal PWRDN of low level, to transfer the external supply voltage VDD to the output switching device P211. Moreover, the second switching device is turned off by the power down signal PWRDN, to perform the analog operation according to the output signal of the comparator 211. On the other hand, the second switching device N211 is turned off by the power down signal PWRDN for operating the output switching device P211 according to the output signal of the comparator 211

During this, the supply voltage VDLL of the delay locked loop 220 generated from the VDLL supply voltage generator 210 is feedback to the second input terminal. As a result, the output switching device P211 is performed by the analog-type operation, to control the supply voltage VDLL to an identical level to the reference voltage VREF inputted to the first input terminal of the comparator 211.

The delay locked loop 220 is operated by the supply voltage VDLL generated through the operations.

The power down signal PWRDN is inputted to high level after entering from the normal operating period to the power down period. In this case, the operation of the delay locked loop 220 is stopped and the operation of the VDLL supply voltage generator 210 is differentiated as well.

For more detailed description, the external supply voltage VDD is not transferred to the output switching device P21, by turning off the first switching device P212 according to the power down signal PWRDN of high level. Furthermore, the transmission gate T211 is turned off due to the power down signal PWRDN and the second switching device N211 is turned on. Accordingly, the output switching device P211 is not operated by the output signal of the comparator 211, but is turned on by a ground voltage Vss transferred through the second switching device N211 in a turn-on state. While this, since the output switching device is turned on but the external supply voltage VDD is blocked by the first switching device P212, the output switching device P211 doesn't switch any voltage. That is, contrary to the conventional art, the output switching device P211 of the VDLL supply voltage generator 210 maintains to be turned on in the power down period, but doesn't consume power by blocking all the current paths.

On the other side, a level of the supply voltage VDLL is maintained in the output terminal of the VDLL supply voltage generator 210.

When entering from the power down period to the normal operating mode, the first switching device P212 is turned on again, to transfer the external supply voltage VDD to the output switching device P211. Here, because the output switching device maintains to be turned on, the external supply voltage VDD is transferred as it is, thereto maximizing the driving power of the VDLL supply voltage generator 210. The driving power of the VDLL supply voltage generator 210 is maximized at the moment of escaping from the power down period, which results in preventing the supply voltage VDLL from lowering although many delay locked loops 220 are operated at the same time, transiently.

And then, as time passes, the supply voltage VDLL is feedback to the comparator 211. Moreover, as the output switching device P211 is operated by the output signal of the comparator 211, the supply voltage VDLL is controlled to a target level.

As described earlier, the present invention prevents the output data access time from Clk tAC for the next read command from being outputted with a delay, by blocking the supply voltage VDLL from a transient lowering regardless of the reacting speed of the VDLL supply voltage generator by means of maximizing the driving power of the VDLL supply voltage generator which generates the supply voltage VDLL of the delay locked loop during entering time from the power down period to the power up period.

At the same time, as the supply voltage VDLL is prevented from lowering without rising the reacting speed of the VDLL supply voltage generator, it is advantageous to prevent the distorting phenomenon of the supply voltage VDLL in response to a fast reacting speed of the VDLL supply voltage generator.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. An internal supply voltage generator for a delay locked loop circuit, including:
    a comparator of which a reference voltage is applied to a first input terminal and an output terminal of the internal supply voltage generator is connected to a second input terminal;
    an output switching device which is connected between the output terminal and an external supply voltage terminal, and operates according to an output signal of the comparator; and
    an output controller which blocks the output signal of the comparator and the external supply voltage transferred to the output switching device and sets to turn on the output switching device, in a power down period according to a control signal, and which transfers the output signal of the comparator and the external supply voltage to the output switching device.

2. The internal supply voltage generator of claim 1, wherein the output switching device is performed by an analog-type operation according to the output signal of the comparator.

3. The internal supply voltage generator of claim 1, wherein the output switching device is comprised of a PMOS transistor.

4. The internal supply voltage generator of claim 1, wherein the output controller includes:
    a first switching device which is connected between the external supply voltage terminal and the output switching device, and blocks the external supply voltage in the power period according to the control signal;
    a second switching device setting to turn on the output switching device in the power down period by switching a ground voltage according to the control signal; and
    switching units blocking the output signal of the comparator in the power down period according to the control signal.

5. The internal supply voltage generator of claim 4, wherein the switching units includes:
    an inverter for inverting the control signal; and
    a transmission gate operating according to an output signal of the inverter and the control signal.

* * * * *